(12) United States Patent
Gurrum et al.

(10) Patent No.: US 10,204,842 B2
(45) Date of Patent: Feb. 12, 2019

(54) SEMICONDUCTOR PACKAGE WITH A WIRE BOND MESH

(71) Applicant: Texas Instruments Incorporated, Dallas, TX (US)

(72) Inventors: Siva Prakash Gurrum, Allen, TX (US); Amit Sureshkumar Nangia, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/896,860

(22) Filed: Feb. 14, 2018

(65) Prior Publication Data

US 2018/0233422 A1     Aug. 16, 2018

Related U.S. Application Data

(60) Provisional application No. 62/459,454, filed on Feb. 15, 2017.

(51) Int. Cl.
  *H01L 23/00* (2006.01)
  *H01L 23/16* (2006.01)
  *H01L 23/495* (2006.01)

(52) U.S. Cl.
  CPC ........ *H01L 23/16* (2013.01); *H01L 23/49503* (2013.01); *H01L 23/49541* (2013.01);
  (Continued)

(58) Field of Classification Search
  CPC ........... H01L 2224/48247; H01L 24/48; H01L 2224/49175; H01L 24/49; H01L 23/49541
  See application file for complete search history.

(56) References Cited

U.S. PATENT DOCUMENTS

| 5,309,321 A | 5/1994 | Olla et al. |
| 5,927,193 A * | 7/1999 | Balz .................. B41M 1/12 101/126 |

(Continued)

FOREIGN PATENT DOCUMENTS

| KR | 20020006105 A | 1/2002 |
| WO | 2006131776 A1 | 12/2006 |

OTHER PUBLICATIONS

Nangia, Amit Sureshkumar; Gurrum, Siva Prakash; Seetharaman, Janakiraman; U.S. Appl. No. 15/853,345, filed Dec. 22, 2017 for "A Semiconductor Package With Filler Particles In A Mold Compound".

(Continued)

*Primary Examiner* — Ngan Ngo
(74) *Attorney, Agent, or Firm* — Dawn Jos; Charles A. Brill; Frank D. Cimino

(57) ABSTRACT

A semiconductor package includes a lead frame having a die attach pad and a plurality of leads. A die is attached to the die attach pad and the electrically connected to the plurality of leads. The die includes a plurality of bond pads along a periphery of the die and a bond pad strip surrounding a circuit in the die. A first plurality of bond wires is bonded between first opposite sides of the bond pad strip. The first plurality of bond wires is aligned in a first direction. A second plurality of bond wires is bonded between second opposite sides of the bond pad strip. The second plurality of bond wires is aligned in a second direction. Mold compound covers portions of the lead frame, the die, the bond pad strip, the first plurality of bond wires and the second plurality of bond wires.

20 Claims, 7 Drawing Sheets

(52) U.S. Cl.
CPC .............. *H01L 24/03* (2013.01); *H01L 24/48* (2013.01); *H01L 24/49* (2013.01); *H01L 24/85* (2013.01); *H01L 2224/48247* (2013.01); *H01L 2224/49175* (2013.01)

(56) References Cited

U.S. PATENT DOCUMENTS

| | | | | |
|---|---|---|---|---|
| 5,960,307 | A * | 9/1999 | Stark | H01L 21/4853 438/612 |
| 6,770,963 | B1 * | 8/2004 | Wu | H01L 23/50 257/691 |
| 2002/0047186 | A1 * | 4/2002 | Tellkamp | H01L 23/49582 257/666 |
| 2004/0231872 | A1 | 11/2004 | Arnold et al. | |
| 2009/0026595 | A1 | 1/2009 | Kadoi | |
| 2009/0187872 | A1 | 7/2009 | McElvain et al. | |
| 2012/0168918 | A1 * | 7/2012 | O | H01L 23/49531 257/668 |
| 2014/0001615 | A1 * | 1/2014 | Otremba | H01L 23/49548 257/676 |
| 2015/0014833 | A1 * | 1/2015 | Tiu | H01L 23/49575 257/676 |
| 2015/0097278 | A1 * | 4/2015 | Bai | H01L 23/49541 257/676 |
| 2016/0204053 | A1 * | 7/2016 | Hsieh | H01L 23/49503 174/251 |
| 2018/0166363 | A1 * | 6/2018 | Heppner | H01L 23/48 |

OTHER PUBLICATIONS

International Search Report for PCT/US2018/018452 dated May 17, 2018.

* cited by examiner

SEMICONDUCTOR PACKAGE WITH A WIRE BOND MESH

CROSS REFERENCE TO RELATED APPLICATIONS

This application claims priority from U.S. Provisional Patent Application 62/459,454 filed on Feb. 15, 2017, which is hereby incorporated by reference in its entirety.

TECHNICAL FIELD

The present disclosure relates generally to semiconductor packages, and more particularly to semiconductor packages with wire bonds.

BACKGROUND

A semiconductor package includes a semiconductor die attached to a lead frame and electrically connected to leads of the lead frame. A package encapsulate, for example, mold compound protects the semiconductor die from outside operating environment. Some high precision analog devices (e.g., data converters, amplifiers, voltage or current references, sensors, etc.) may suffer a reduction in the precision of various parametric as a result of packaging the semiconductor die. Such reduction in precision may manifest itself as an increase in parametric distributions (e.g., distributions of offset voltages, reference voltages, etc.) which, in turn limits how narrowly certain parameters can be specified for the semiconductor package. One main reason for stresses in the semiconductor package is the filler particles in the mold compound. Typically, 80-90% of the mold compound is composed of filler particles. The mold compound also has epoxy resin and hardeners. A coefficient of thermal expansion (CTE) is substantially different for the filler particles and the resin. Because the resin and the filler particles have substantially different values for CTE, the semiconductor package can experience local stress variations across the semiconductor die due to temperature changes.

SUMMARY

One aspect provides a semiconductor package. The semiconductor package includes a lead frame having a die attach pad and a plurality of leads. A die is attached to the die attach pad and electrically connected to the plurality of leads. The die includes a plurality of bond pads along a periphery of the die and a bond pad strip surrounding a circuit in the die. A first plurality of bond wires is bonded between first opposite sides of the bond pad strip. The first plurality of bond wires is aligned in a first direction. A second plurality of bond wires is bonded between second opposite sides of the bond pad strip. The second plurality of bond wires is aligned in a second direction. Mold compound covers portions of the lead frame, the die, the bond pad strip, the first plurality of bond wires and the second plurality of bond wires.

In another aspect provides a semiconductor package includes a die with a plurality of bond pads along a periphery of the die and a bond pad strip surrounding a circuit in the die. A first plurality of bond wires is bonded between first opposite sides of the bond pad strip, and the first plurality of bond wires is aligned in a first direction. A second plurality of bond wires is bonded between second opposite sides of the bond pad strip, and the second plurality of bond wires is aligned in a second direction. Mold compound covers portions of the lead frame, the die, the bond pad strip, the first plurality of bond wires and the second plurality of bond wires.

Yet another aspect provides a method for packaging a semiconductor die. The die is attached to a die attach pad of a lead frame. A first plurality of bond wires is attached, in a first direction, between first opposite sides of a bond pad strip. The bond pad strip is on a surface of the die and surrounding a circuit in the die. Then, a second plurality of bond wires is attached, in a second direction, between second opposite sides of the bond pad strip. Thereafter, the die is electrically connected to a plurality of leads of the lead frame. Using mold compound, portions of the die, the first and second plurality of bond wires, and the lead frame are covered.

Other aspects and example embodiments are provided in the Drawings and the Detailed Description that follows.

BRIEF DESCRIPTION OF THE VIEWS OF DRAWINGS

DETAILED DESCRIPTION

Stresses from packaging can impact performance of components on a semiconductor die (hereinafter "die"), such as transistors, resistors, and capacitors. It has been determined that a source of the problem is the size of filler particles that comprise the mold compound used during the packaging process of the die. The disclosed examples address the aforementioned problem by limiting the maximum size of the filler particles in a semiconductor package, near the circuits in the die.

Figure 1:
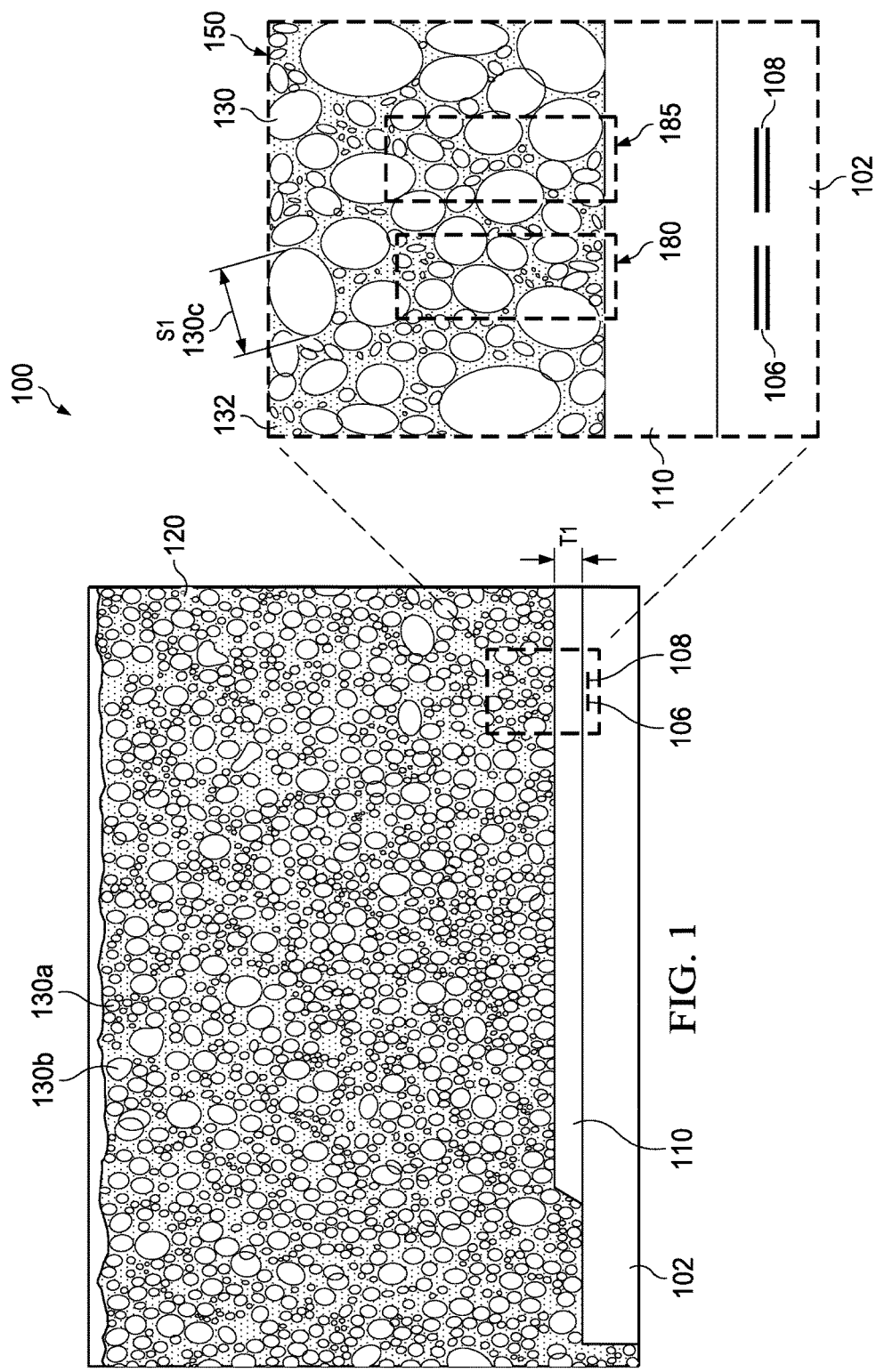
FIG. 1 illustrates a portion of a cross-section of a semiconductor package having mold compound.

FIG. 1 illustrates a portion of a cross-section of the semiconductor package 100. The semiconductor package 100 includes a die 102 on which an integrated circuit is formed, a stress buffer layer 110, and a mold compound 120. The integrated circuit includes capacitors 106 and 108 and/or additional components. The stress buffer layer 110 covers the die 102, and the mold compound 120 is provided on a surface of the stress buffer layer 110 opposite the integrated circuit. The mold compound is also on portions of the die 102. The integrated circuit formed on the die is, for example, a voltage reference, a current reference, a sensor, a data converter (such as an analog-to-digital converter), an amplifier, or any other type of circuit.

The stress buffer layer 110 is a polyimide, a silicone-based material, or other suitable material to reduce mold compound-induced stress on the integrated circuit. The stress buffer layer 110 reduces the variations in stress due to filler particles in the mold compound 120 on the semiconductor substrate 102. The stress buffer layer has a thickness designated as T1 in FIG. 1. The thickness of the stress buffer layer 110 is in the range of 1 micrometer (micron) to 50 microns.

The mold compound 120 includes a resin 132 (e.g., a polymer resin), and the resin 132 includes filler particles 130 (see enlarged image 150 of a portion of the package 100). Two filler particles have been identified in FIG. 1 as filler particles 130a and 130b. The filler particles in the mold compound are collectively referred to herein as filler particles 130. The filler particles 130 include silica (SiO2), alumina (Al2O3), or other suitable material. Silica fillers reduce moisture absorption by the mold compound and lower the mold compound's coefficient of thermal expansion (CTE).

As can be seen in the example of FIG. 1, the filler particles 130 in the mold compound 120 have multiple sizes. That is, some filler particles 130 are larger than other filler particles. For example, filler particle 130b is larger than filler particle 130a.

Reference is made herein to the "size" of the filler particles 130. In the example in which a filler particle 130 is spherical, the size of that particular filler particle is the diameter of the sphere. In examples in which a filler particle 130 is non-spherical and has a non-geometric shape, the size may refer to the largest distance between opposite surfaces of the filler particle. In the magnified view 150, filler particle 130c is shown to have a size S1 which represents the largest distance across the filler particle.

It has been determined that that filler particles 130 and the resin 132 in which the filler particles 130 reside have different coefficient of thermal expansion (CTE) and moduli (the measure of the ability of a material to withstand changes in length when under lengthwise tension or compression). Because the resin 132 and the filler particles 130 have substantially different values for CIE and modulus, a package can experience local stress variations across the semiconductor substrate (die) due to temperature changes. Large filler particles induce higher stress gradients on the semiconductor substrate. For example, FIG. 1 illustrates a pair of capacitors 106 and 108 which, as noted above, may be part of an integrated circuit formed on the semiconductor substrate 102. Such capacitors may be used in, for example, a successive approximation register analog-to-digital converter (SAR ADC). To improve the precision and accuracy of the SAR ADC, the capacitors 106 and 108 are matched (e.g., same capacitance value). The mismatch of the capacitors should not vary more than a threshold amount without impacting the precision of the SAR ADC. However, the local stresses caused by the mold compound, if the mold compound contains filler particles greater than 50 microns in size, can detrimentally impact how closely the capacitors remain matched.

Figure 2:
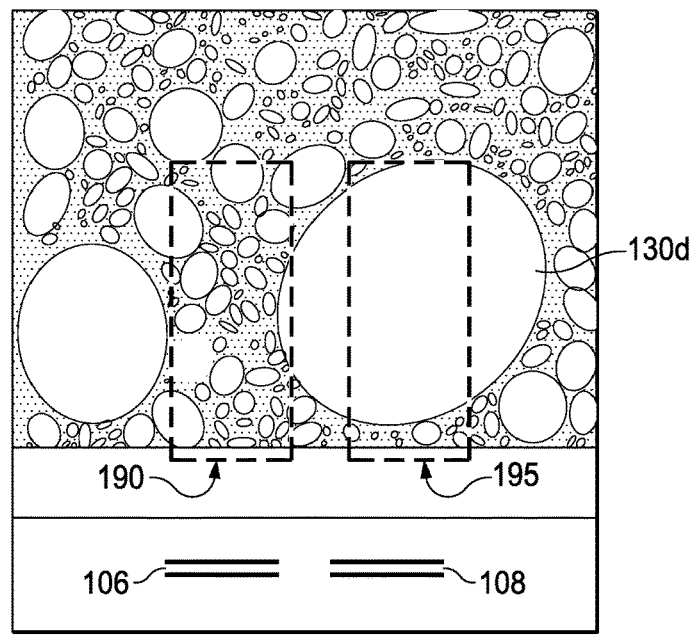
FIG. 2 illustrates a semiconductor package having mold compound with large filler particles.

FIG. 2 illustrates a mold compound with filler particles that have sizes larger than 50 microns (referred to as "large filler particles"). Filler particle 130d, for example, may have a size of 75 microns or larger. At that size, filler particle 130d exerts different stress on the underlying capacitor 108 than adjacent areas. The filler particles above capacitor 106 (identified generally at 190), however, are smaller than filler particle 130d in the region 195 above capacitor 108 and thus capacitor 106 may experience a different stress level with varying temperature than capacitor 108. As more resin 132 is present in the region 190 above capacitor 106 and because resin has a substantially different CTE and modulus than filler particles 130 made from silica, capacitor 106 experiences a substantially different level of stress than capacitor 108 due to variations in temperature and other stress factors.

Various examples of this disclosure address the problem of stress induced, due to large filler particle, by filtering the large particles using a wire bond mesh. The wire bond mesh over a circuit in the die, filters the large filler particles such that the large filler particle remains at a distance from the circuit in the die, and therefore, reduces the stress induced by the large filler particles.

Figure 3:
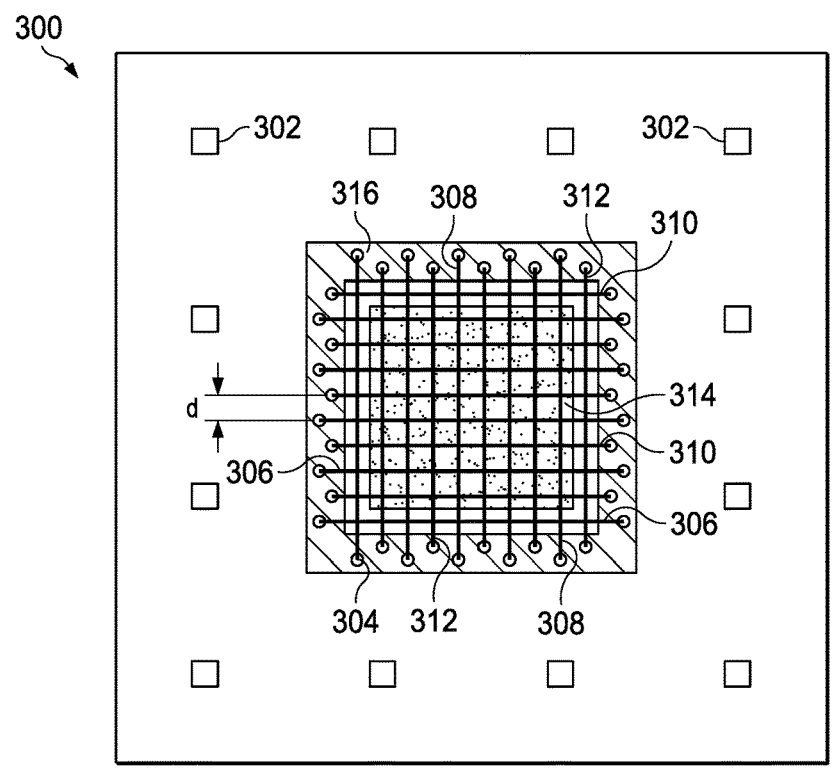
FIG. 3 is a plan view of a die with a wire bond mesh according to an example.

Referring now to FIG. 3, a plan view of the die 300 with the wire bond mesh according to an example is illustrated. FIG. 3 illustrates the die 300 (singulated from a finished semiconductor wafer) having a plurality of bond pads 302, a circuit 314 in the die 300, a bond pad strip 316, and a wire bond mesh formed by bond wires 306, 308, 310 and 312 that are attached to the sides of the bond pad strip 316. Each of the bond wires 306, 308, 310 and 312 has two ends attached to opposite sides of the bond pad strip 316. The bond pad strip 316 is on an active surface of the die 300. In one example, the bond pad strip 316 is a continuous metal piece that is shaped as a rectangle. In another example, the shape of the bond pad strip 316 includes a square, or circle, or any other closed structure that surrounds the circuit 314 in the die 302. In yet another example, the bond pad strip is a structure that partially surrounds the die. In this example, there are bond pad strip 316 surfaces on opposite ends of the circuit, but those surfaces are not necessarily physically touching each other. A surface of the bond pad strip 316 is formed of a bondable metal such as gold, aluminum, or alloys thereof. In one example, the bond pad strip 316 is electrically connected to a ground voltage. A wire bond connection (not shown in FIG. 3) is used to electrically connect the bond pad strip 316 to the ground voltage.

The wire bond mesh includes a first plurality of bond wires 306 and a third plurality of bond wires 310 aligned and bonded in a first direction (approximately in a horizontal direction), and a second plurality of bond wires 308 and a fourth plurality of bond wires 312 aligned in a second direction (approximately in a vertical direction). The first direction is approximately perpendicular to the second direction from a plan view. The term 'approximately perpendicular' used herein includes variations from 90 degrees that occur due to the tolerances of manufacturing.

In one example, each of the first 306 and third 310 pluralities of bond wires touch each of the second 308 and fourth plurality of bond wires 312. In another example, first 306 and third 310 pluralities of bond wires are below the second 308 and fourth plurality of bond wires 312 from a side view of the die 300. FIG. 3 shows five wires of each of the bond wires 306, 308, 310 and 312 for illustrative purposes. The number of each of the bond wires 306, 308, 310 and 312 is not limited to five and it can be based on the design requirements of the device. The design requirements include size of the circuit, size of the die and shape of the circuit. In one example, the number of each of the bond wires 306, 308, 310 and 312 is between 5-200 wires. In one example, only first and second plurality of wires 306 and 308 are present.

Each of the plurality of bond wires include copper or a copper alloy because of its high thermal conductivity (4.01 W cm$^{-1}$ K$^{-1}$), approaching the best value of silver, 4.29 W cm$^{-1}$K$^{-1}$). Alternatively, gold or a gold alloy may be used; the thermal conductivity of gold (3.17 W cm$^{-1}$ K$^{-1}$) is less than the one of copper, but the gold's bondability is better because of gold's more noble electrochemical character. Dependent on the gold wire diameter, alloys with about 1% or less beryllium, copper, palladium, iron, silver, calcium, or magnesium may allow better control of the heat-affected zone in ball formation (which would be mechanically weak for bending or other deformation stresses) and for enhancing the elasticity of the wire. Alternatively, the plurality of bond wires includes aluminum or an aluminum alloy. Copper wire can also be coated with palladium in another example.

In one example, each of the plurality of bond wires 306, 308, 310, and 312 has a ball bond on one side and a stand-off-stitch bond (SSB) on the other side. For instance, the bond wires 306 and 310 have the ball bond on the left side (as shown in FIG. 3) of the die 300 and the stand-off-stitch bond on the right side (as shown in FIG. 3). Similarly, the bond wires 308 and 312 have the ball bond on top side (as shown in FIG. 3) of the die 300 and the stand-off-stitch bond at the bottom side of the die 300 (as shown in FIG. 3). In another example, each of the plurality of bond wires 306, 308, 310, and 312 is a ribbon wire with two ribbon bond attaching each of the plurality of ribbon wires to two opposite ends of the bond pad strip 316. The process of wire bonding and ribbon bonding is explained in detail in connection with FIG. 8.

Each of the third plurality of bond wires 310 is in between two of the first plurality of bond wires 306, and each of the fourth plurality of bond wires 312 is in between two of the second plurality of bond wires 306. As can be seen from FIG. 3, a length of each of the third plurality of bond wires 310 is less than a length of each of the first plurality of bond wires 306. Similarly, a length of each of the fourth plurality of bond wires 312 is less than a length of each the second plurality of bond wires 308. It is noted that two consecutive ball bonds (or stand-off stich bonds) require a minimum gap (approximately 5 micrometers) between them that limits the number of bonds on the bond pad strip 316 in one line. By having a set of bonds that is offset from another set of ball bonds, more number of bond wires can be attached to the bond pad strip 316, increasing the density of the wire bonds in the wire bond mesh. The wire bonds that are offset are shorter wires (310 and 312) compared to the bond wires 306 and 308. The minimum gap is marked as distance 'd' between two consecutive balls bonds in FIG. 3. The distance 'd' depends on the size of the filler particles in the mold compound that should be filtered by the wire bond mesh.

The circuit(s) 314 in the die 300 is a sensitive circuit where any stress within the package affects the performance of the circuit 314. Examples of circuit(s) include a data converter (for example, a successive approximation register analog-to-digital converter, amplifier, voltage reference circuits, capacitors, etc. The bond pads 302 along the periphery of the die are conductive pads that provide electrical connection to and from the die 300. When packaged, a plurality of wire bonds (fifth plurality of wire bonds, shown in FIG. 5) are bonded to each of the bond pads 302 of the die 300. The bond pads 302 in FIG. 3 are either square shaped or rectangular shaped.

Figure 4:
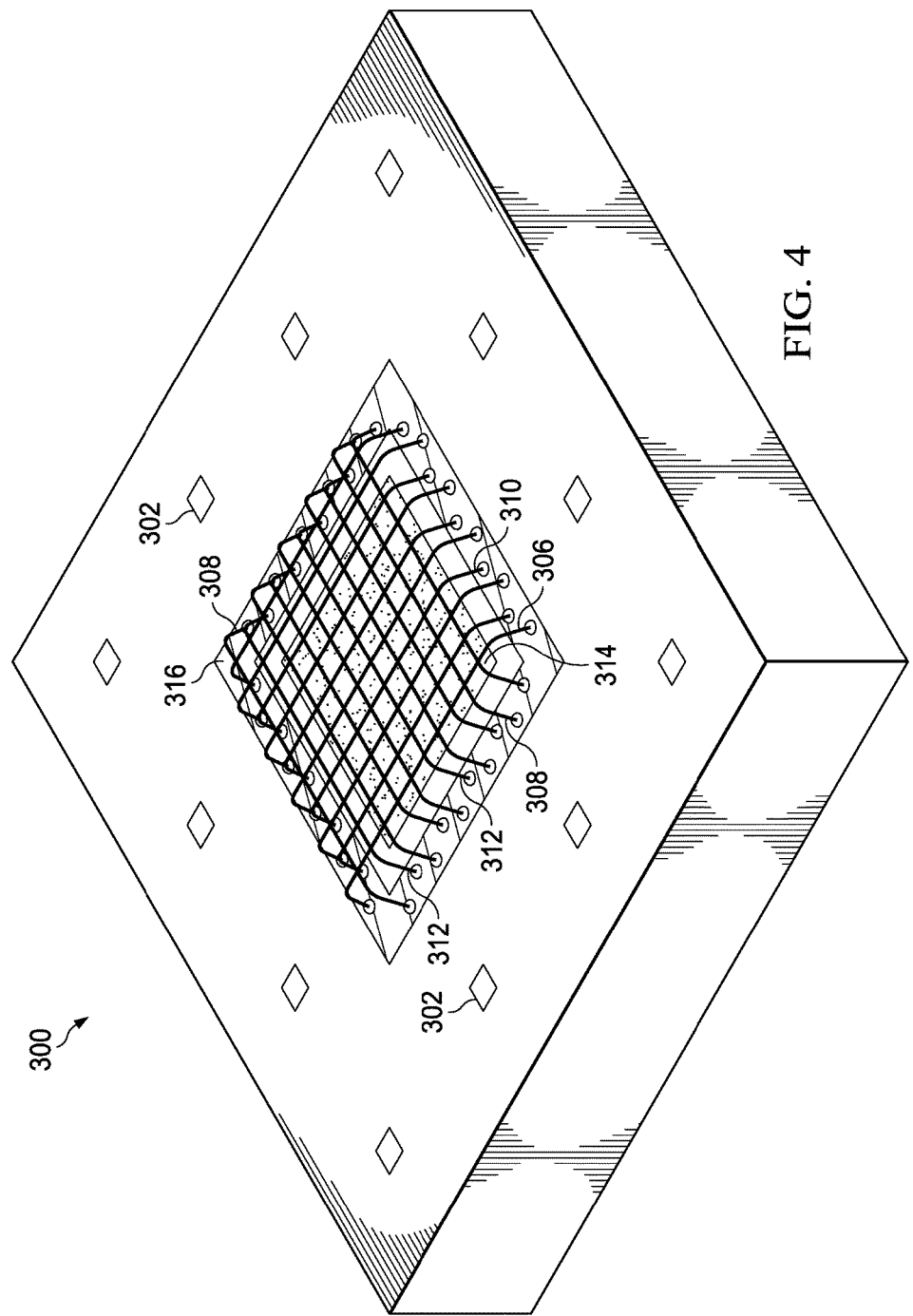
FIG. 4 is a three dimensional view of the die with the wire bond mesh according to an example.

A three dimensional view of the die 300 with the wire bond mesh of FIG. 3 is illustrated in FIG. 4. FIG. 4 has all components as in FIG. 3 with the same reference numerals and therefore, is not explained again for the sake of simplicity. It is noted that each of the plurality of bond wires 306, 308, 310, and 312 of the wire bond mesh is not connected to a signal or a power terminal of the die. During operation of the die 300, the wire bond mesh can accumulate charge around it. To avoid charge accumulation, the bond pad strip 316 is electrically connected to a ground voltage.

In one example, a diameter of each of the plurality of bond wires 306, 308, 310, and 312 is between 15-100 micrometers for gold and copper wires. In case of aluminum wires, the diameter of the wires (306, 308, 310, and 312) can be up to 500 micrometers. In case of ribbon wires, each of the ribbon wires 306, 308, 310, and 312 has a thickness between 6-300 micrometers and a width between 20 micrometers to 2 millimeters. A distance between two consecutive bond wires of the plurality of bond wires 306, 308, 310, and 312 is between 5-15 micrometers.

Figure 5:
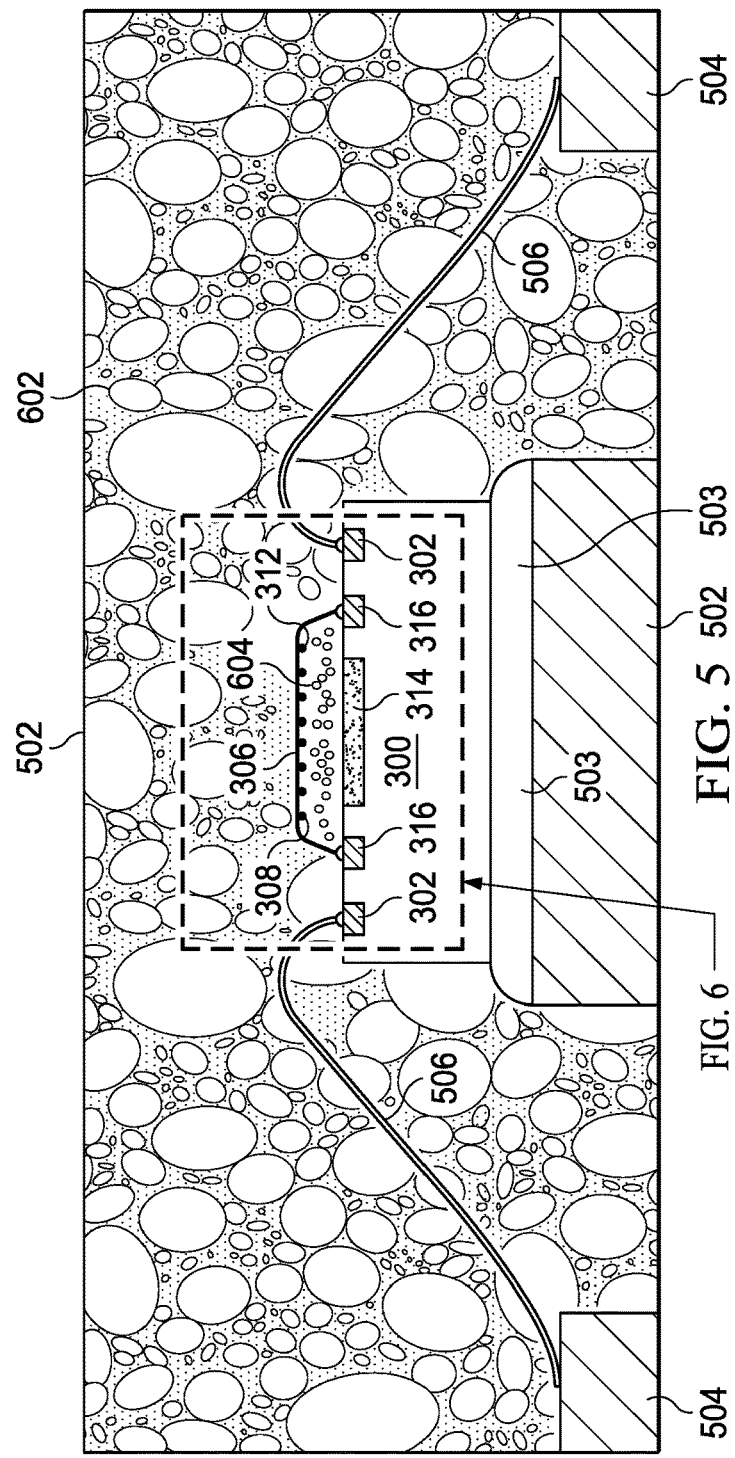
FIG. 5 is a cross-sectional view of the die in a quad flat no-lead (QFN) package according to an example.

FIG. 5 is a cross-sectional view of the die in a quad flat no-lead (QFN) package according to an example. The QFN package includes a die attach pad 502 and a plurality of leads 504. The die attach pad 502 and the leads 504 are part of what is referred to as a lead frame. The lead frame is made from a sheet of a base metal, which is selected from a group including copper, copper alloys, aluminum, aluminum alloys, iron-nickel alloys, and Kovar™. For many devices, parallel surfaces of the lead frame base metal are treated to create affinity for adhesion to mold compound. As an example, the surfaces of copper lead frames are oxidized, since copper oxide surfaces are known to exhibit good adhesion to molding compounds. Other methods include plasma treatment of the surfaces, or deposition of thin layers of other metals on the base metal surface. As an example, for copper lead frames, plated layers of tin are used. A layer of nickel (about 0.5 to 2.0 μm thick) followed by a layer of palladium (about 0.01 to 0.1 μm thick) optionally followed by an outermost layer of gold (0.003 to 0.009 μm thick) can also be used for copper lead frames. It should be noted that other examples may use other types of lead frames with a die attachment pad, such as lead frames with elongated leads, with cantilevered leads, or with frames having one or more pads in a plane offset from the plane of the leads. Alternatively, the lead frame is of laminated substrates made of insulating material alternating with conductive layers. These substrates may have an area suitable for attaching one or more chips, and conductive connections suitable for stitch bonding wires.

A back side (inactive side) of the die 300 is attached to the die attach pad 502 using a die attach material 503. The die attach material is a eutectic material layer, such as a gold-silicon (Au—Si) eutectic layer, a silver-silicon (Ag—Si), or an organic die attach material, such as an epoxy or a polyimide. The die 300 is electrically connected to the leads 504 via bond wires 506. The bond wires 506 are made of the same material as the plurality of bond wires 306, 308, 310, and 312 of the wire bond mesh, which is copper, gold, or aluminum. One end of each of the bond wires 506 is attached to respective the bond pads 302 of the die 300 using a ball bond and the other end is attached to the respective leads 504 via a stitch bond or a wedge bond.

The QFN package has no lead 504 extending beyond a package body. The leads 504 are generally rectangular shaped from a top view of the package. Two sides of each of the leads 504 are exposed from the package body. One side of each of the leads 504 is coplanar with the bottom side of the package. The term "coplanar" means that the elements lie in the same plane. However, in manufacturing, some variations on surface heights occur due to the tolerances of manufacturing. The term "coplanar" used herein means two elements intended to be in the same plane, even if slight differences in one or the other of the surfaces as manufactured are slightly out of plane. Elements positioned so the surfaces of the two elements are intended to lie in a common plane are coplanar. One side of the die attach pad 502 is exposed from the bottom side of the package, for heat transfer from the QFN package. The QFN package is attachable to a printed circuit board (PCB, not shown) via solder.

The wire bond mesh is attached to the bond pad strip 316 as explained in connection with FIG. 3. Only one wire 306 can be seen that is aligned in the horizontal direction due to the cross sectional view. The second and fourth plurality of wires 308 and 312, are shown under the wire 306. It can be seen that each of the first 306 (and third 310) pluralities of bond wires which is not shown in FIG. 5) touch each of the second 308 and fourth plurality of bond wires 312. In another example, the first 306 (and third 310) pluralities of bond wires are below the second 308 and fourth plurality of bond wires 312.

Mold compound 505 covers portions of the lead frame (502 and 504), the die 300, the bond pad strip 316, the circuit 314, and the plurality of wires 306, 308, 310, and 312. The mold compound 505 includes a thermoset compound. The thermoset compound consists of an epoxy novolac resin or similar material combined with filler particles, such as alumina. Other materials such as accelerators, curing agents, fillers, and mold release agents are added to make the mold compound suitable for molding. The compound may be further characterized by low viscosity and thixotropic behavior so that it exhibits weakened constitution when disturbed and strengthened behavior when left standing. Since the modulus of a material characterizes its strain response to an applied stress (or pressure), mold compound has compliant mechanical characteristics. As explained earlier the filler particles have various sizes, categorized as large filler particles and small filler particles.

The plurality of bond wires 306, 308, 310, and 312 of the wire bond mesh functions like a sieve that lets only the small filler particles (604, referring to FIG. 6) through the wire bond mesh. Small filler particles refer to the size of the particles between 1-50 micrometers. The large filler particles 602 do not pass through the wire bond mesh and stays on top side of the wire bond mesh as shown in the cross sectional view of FIG. 6. The large filler particles refer to the size of the particles more than 50 micrometers. Since the large filler particles 602 remains away from the circuit 314 in the QFN package, any stress induced by the large filler particles on the circuit 314 is reduced.

Various examples have been described herein using the QFN package as an example. It is noted that the wire bond mesh formed by the plurality of bond wires 306, 308, 310, and 312 can be employed in any type of semiconductor package having a die with a bond pad strip on the active surface of the die.

Figure 6:
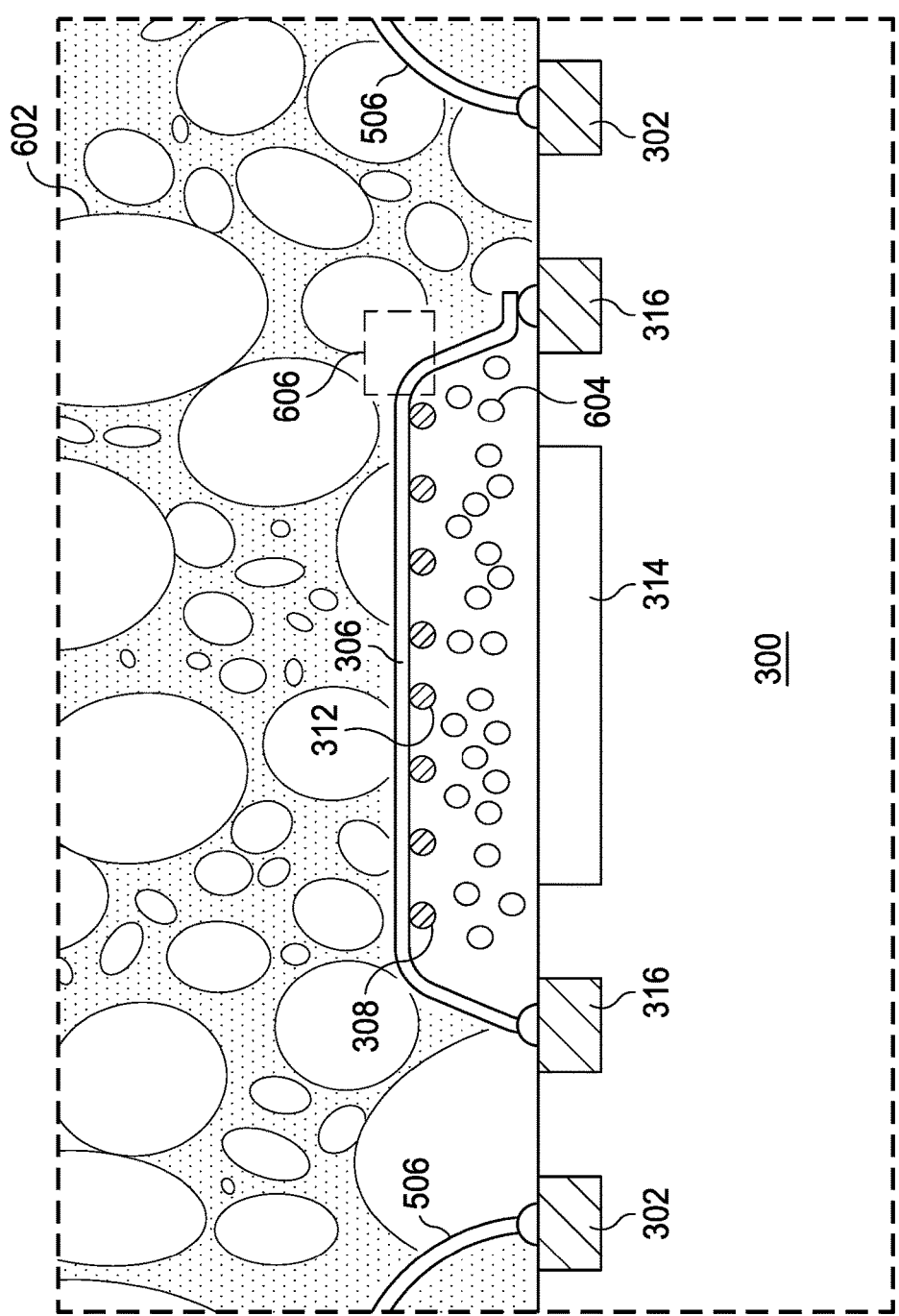
FIG. 6 is an enlarged cross-sectional view of a portion of FIG. 5 showing the wire bond mesh and filler particles in the mold compound.

Each of the plurality of bond wires 306, 308, 310, and 312 includes two kinks 606 as shown in FIG. 6. A kink means a curve or a change in angle in the bond wire with respect to a previous point in the bond wire. In one example, an angle of the kink is approximately 45 degrees. Note that there can be variations from 45 degrees in the kink that occur due to the tolerances of manufacturing. The kinks raise a height of the wire bond mesh such that the large filler particles 602 in the mold compound 505 remain at a distance from the circuit 314 in the semiconductor package.

Figure 7:
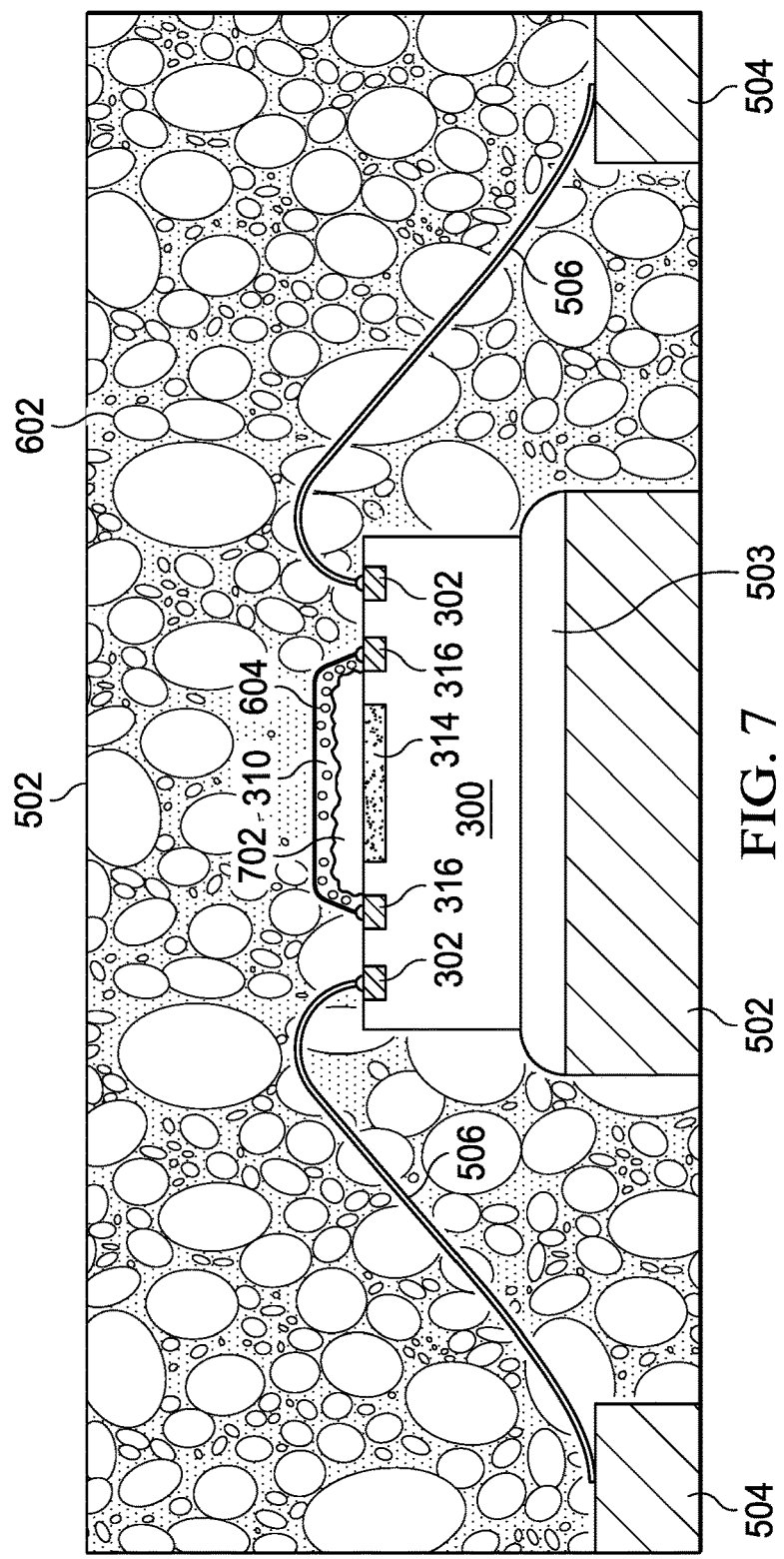
FIG. 7 is a cross-sectional view of the die in the QFN package showing a void between the mold compound and a surface of the die according to an example.

Referring now to FIG. 7, a cross-sectional view of the die 300 in a QFN package is illustrated, showing a void 702 between the mold compound 505 and a surface of the die 300. FIG. 7 illustrates the mold compound 505 after it is cured. Before the curing stage, the mold compound 505 is heated so that it forms a viscous compound. When the mold compound 505 is injected through the mold (process of molding explained in detail in connection with the description of FIG. 8), it takes a path with least resistance. The plurality of bond wires 306, 308, 310, and 312 of the wire bond mesh is path with resistance, and therefore, the mold compound bypasses the area of the wire bond mesh to some extent. Some portions of the mold compound 505 having the small filler particles may pass through the wire bond mesh, but not enough the cover an area under the wire bond mesh. This creates a void 702 over a portion of the die 300 and under the plurality of bond wires 306, 308, 310, and 312 of the wire bond mesh. Alternatively, there can be multiple voids over the portion of the die 300 and under the plurality of bond wires 306, 308, 310, and 312 of the wire bond mesh. The term 'void' used herein means an area over a portion of the die 300 that is not filled with mold compound 505.

Figure 8:
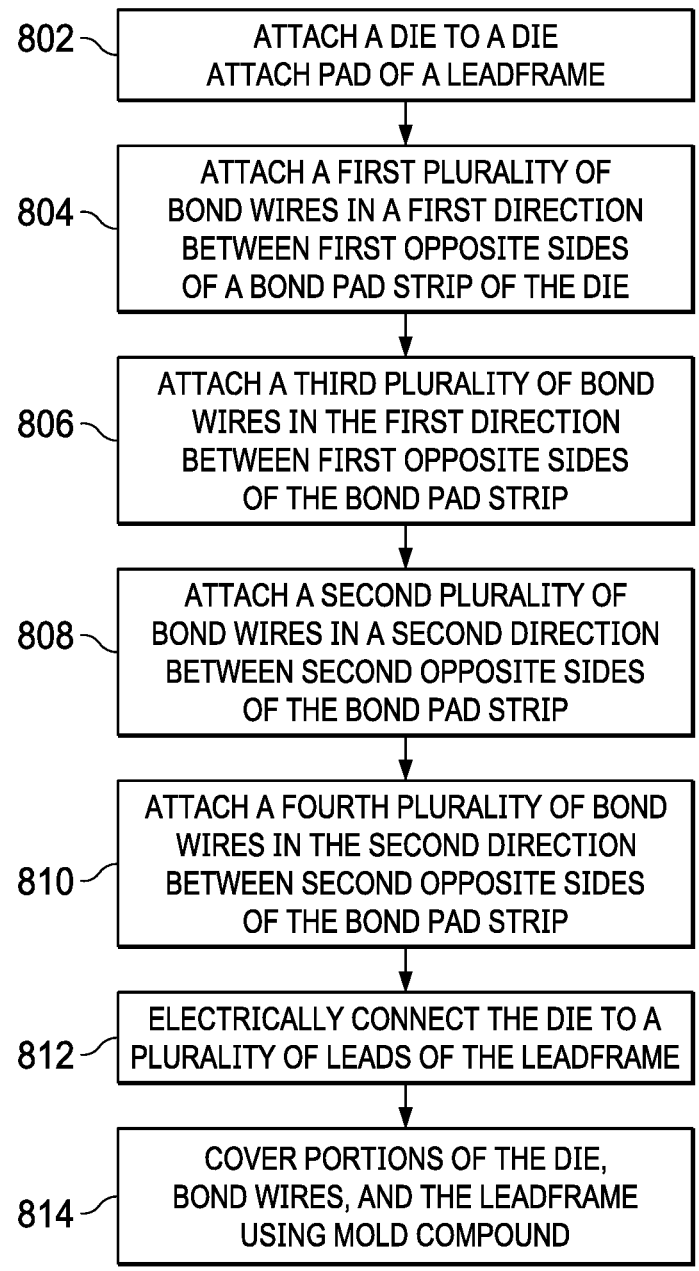
FIG. 8 is a flow diagram illustrating a method for packaging a semiconductor die according to an example.

FIG. 8 is a flow diagram illustrating a method for packaging a semiconductor die according to an example. At step 802, a die 300 is attached to a die attach pad 502 of a lead frame. A finished semiconductor wafer that includes multiple dies is singulated to create separate dies, one of which is attached to the die attach pad 502 at step 802. The die 300 is attached to the die attach pad by an epoxy-based compound. There can be several lead frames connected together in a lead frame strip, and multiple dies can be placed on respective die attach pads for parallel processing. The lead frame strip is fabricated from a metal sheet about 120 to 250 micrometers thick. Most commonly the sheets are made of a base metal such as copper or a copper alloy; alternatively, base metal sheets of aluminum or an iron-nickel alloy are in usage. The fabrication methods include a chemical etching technique, supported by masks, or a stamping technique. The die 300 includes the bond pad strip 316 as explained earlier. At step 804, a first plurality of bond wires 306 is attached in a first direction between first opposite sides of the bond pad strip 316. At step 806, a third plurality of bond wires 310 is attached in the first direction between first opposite sides of the bond pad strip 316.

The bond wires are attached using the ball bond on one side and the SSB on the other side. The ball bonding process uses a combination of heat, pressure, and ultrasonic energy to make a bond at one end of each of the plurality of bond wires 306, 308, 310, and 312. The ball bonding process begins by positioning the die 300 on a heated pedestal to raise the temperature to between 150 and 300° C. The bond wire is strung through a capillary. At the tip of the bond wire, a free air ball is created using either a flame or a spark technique. The ball has a diameter from about 1.2 to 1.6 wire diameters. The capillary is moved towards the bond pad strip 316 and the ball is pressed against the bond pad strip 316. For gold wires and aluminum pads, a combination of compression force and ultrasonic energy creates the formation of gold-aluminum intermetallics and thus a strong metallurgical bond. The compression (also called Z- or mash) force is between about 17 and 75 g; the ultrasonic time between about 10 and 20 milliseconds; and the ultrasonic power between about 20 and 50 mW. At time of bonding, the temperature ranges from 150 to 270° C. In the case of copper wire on copper pad, only metal interdiffusion takes place in order to generate a strong weld.

After attaching the first and third plurality of bond wires, the process moves to attach the second and fourth plurality of bond wires at steps 808 and 810 respectively. The second 308 and fourth 312 bond wires are attached in a direction approximately perpendicular to the first and second bond wires and to the second opposite sides of the bond pad strip 316. At steps 808 and 810, the capillary moves in the direction approximately perpendicular to the direction of the first and second wire bonds. At step 812, a fifth plurality of wire bonds 506 is attached to the bond pads 302 of the die 300. This step electrically connects the die 300 to the leads 504 of the package. Each of the fifth plurality of bond wires is attached to the respective bond pads 302 via a ball bond and attached to the respective leads 504 via a stich bond.

In SSB bonding, first a ball is created using the technique explained above. Then the capillary moves to the ball and creates a second bond, which is a stich bond, on top of the formed bond surface. In the example of using ribbon bonds, a wedge bonder has the flexibility to run either round wire or ribbon of aluminum or gold material. A deep access bond head of the wedge bonder guides the ribbon wires vertically along the back of the wedge tool and provides two clamping points where it can be clamped to the bond pad strip 316 during a tear-off movement. This movement is a controlled relative movement between the bond head and a table while the clamp is closed. The advantage of ribbon over round wire is the relatively large surface area in proportion to the cross section area. Compared to a 2 mil round wire, a ½×6 mil ribbon has more than twice the surface area with nearly the same cross section area. This feature of ribbon wires is effective in increasing the filtering capability of the wire bond mesh where the width (between 20 micrometers to 2 millimeters) of the ribbon wires functions as effective blockage to the large filler particles in the mold compound 505. The ribbon bonds which can achieve lower loop angles and lower loop heights than round wire bonds that increases the mechanical loop stability of ribbon bonds over the wire bonds. In particular, if the loops are very long in relation to the wire diameter, gravitational pull on the loop sets a limit for loop stability.

At step 814, mold compound 505 is used to cover portions of the die 300, bond wires (306, 308, 310, 312, and 506), and the lead frame. Some methods of molding include transfer molding, cavity direct injection molding, and liquid compression molding. For example, the transfer molding process involves liquidification and transfer of pelletized mold compound in a mold press. The liquidification results in a low viscosity material that readily flows into a mold cavity and completely covers the device. Shortly after the transfer process into the mold cavity, the cure reaction begins and the viscosity of the mold compound 505 increases until the resin system is hardened. A further cure cycle takes place outside the mold in an oven to ensure the mold compound 505 is completely cured. Mold compound 505 protects the QFN package mechanically and environmentally from the outside environment. After molding, the molded lead frame strip is singulated using a mechanical saw to separate the individual QFN packages.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A semiconductor package comprising:
   a lead frame including a die attach pad and a plurality of leads;
   a die attached to the die attach pad and electrically connected to the plurality of leads, the die including a plurality of bond pads along a periphery of the die and a bond pad strip surrounding a circuit in the die;
   a first plurality of bond wires bonded between first opposite sides of the bond pad strip, the first plurality of bond wires aligned in a first direction;
   a second plurality of bond wires bonded between second opposite sides of the bond pad strip, the second plurality of bond wires aligned in a second direction; and
   mold compound covering portions of the lead frame, the die, the bond pad strip, the first plurality of bond wires and the second plurality of bond wires.

2. The semiconductor package of claim 1 further comprising:
   a third plurality of bond wires bonded between the first opposite sides of the bond pad strip, the third plurality of bond wires aligned in the first direction; and
   a fourth plurality of bond wires bonded between the second opposite sides of the bond pad strip, the fourth plurality of bond wires aligned in the first direction, wherein the mold compound covers portions of the third and fourth plurality of bond wires.

3. The semiconductor package of claim 2, wherein:
   a length of the third plurality of bond wires is less than a length of the first plurality of bond wires; and
   a length of the fourth plurality of bond wires is less than a length of the second plurality of bond wires.

4. The semiconductor package of claim 1, wherein the bond pad strip is on an active surface of the die.

5. The semiconductor package of claim 1 further comprising a fifth plurality of bond wires that electrically connects the die to the plurality of leads.

6. The semiconductor package of claim 5, wherein each of the first, second, third, fourth, and fifth plurality of bond wires includes at least one of copper and gold.

7. The semiconductor package of claim 2, wherein:
   each of the first and third plurality of bond wires include a ball bond on one side of the first opposite sides and a stand-off-stitch bond on an another side of the first opposite sides; and
   each of the second and fourth plurality of bond wires include a ball bond on one side of the second opposite sides and a stand-off-stitch bond on another side of the second opposite sides.

8. The semiconductor package of claim 2, wherein:
   each of the first, second, third, and fourth plurality of bond wires include a ribbon wire with two ends attached to the bond pad strip via ribbon bonds.

9. The semiconductor package of claim 1 further comprising a void in between the circuit in the die and the mold compound.

10. The semiconductor package of claim 2, wherein each of the first plurality of bond wires, the second plurality of bond wires, the third plurality of bond wires, and the fourth plurality of bond wires includes at least two kinks.

11. The semiconductor package of claim 2, wherein the second direction is approximately perpendicular to the first direction.

12. The semiconductor package of claim 2, wherein each of the first and third plurality of bond wires touch each of the second and fourth plurality of bond wires.

13. The semiconductor package of claim 2, wherein the first and third plurality of bond wires are below the second and fourth plurality of bond wires.

14. The semiconductor package of claim 1, wherein:
   the first, second, third, and fourth plurality of bond wires are not connected to a signal or a power terminal of the die; and
   the bond pad strip is electrically connected to a ground voltage.

15. A semiconductor package comprising:
   a die including a plurality of bond pads along a periphery of the die and a bond pad strip surrounding a circuit in the die;
   a first plurality of bond wires bonded between first opposite sides of the bond pad strip, the first plurality of bond wires aligned in a first direction;
   a second plurality of bond wires bonded between second opposite sides of the bond pad strip, the second plurality of bond wires aligned in a second direction; and
   mold compound covering portions of the lead frame, the die, the bond pad strip, the first plurality of bond wires and the second plurality of bond wires.

16. The semiconductor package of claim 15 further comprising:
   a third plurality of bond wires bonded between the first opposite sides of the bond pad strip, the third plurality of bond wires aligned in the first direction; and
   a fourth plurality of bond wires bonded between the second opposite sides of the bond pad strip, the fourth plurality of bond wires aligned in the first direction, wherein the mold compound covers portions of the third and fourth plurality of bond wires.

17. The semiconductor package of claim 15 further comprising a void in between the circuit in the die and the mold compound.

18. A method for packaging a semiconductor die, comprising:
   attaching the die to a die attach pad of a lead frame;
   attaching a first plurality of bond wires in a first direction between first opposite sides of a bond pad strip, the bond pad strip on a surface of the die and surrounding a circuit in the die;
   attaching a second plurality of bond wires in a second direction between second opposite sides of the bond pad strip;
   electrically connecting the die to a plurality of leads of the lead frame; and
   covering portions of the die, the first and second plurality of bond wires, and the lead frame using mold compound.

19. The method of claim 18 further comprising, prior to attaching a second plurality of bond wires, attaching a first plurality of bond wires in the first direction between the first opposite sides of the bond pad strip, a length of the third plurality of bond wires is less than a length of the first plurality of bond wires.

20. The method of claim 18 further comprising, attaching a fourth plurality of bond wires in the second direction between the second opposite sides of the bond pad strip, a length of the fourth plurality of bond wires is less than a length of the second plurality of bond wires.

* * * * *